(12) United States Patent
Bower et al.

(10) Patent No.: US 9,660,008 B2
(45) Date of Patent: May 23, 2017

(54) HIGH-YIELD FABRICATION OF LARGE-FORMAT SUBSTRATES WITH DISTRIBUTED, INDEPENDENT CONTROL ELEMENTS

(71) Applicant: Semprius, Inc., Durham, NC (US)

(72) Inventors: Christopher Bower, Raleigh, NC (US); Etienne Menard, Limoges (FR); John Hamer, Rochester, NY (US); Ronald S. Cok, Rochester, NY (US)

(73) Assignee: Semprius, Inc., Durham, NC (US)

( * ) Notice: Subject to any disclaimer, the term of this patent is extended or adjusted under 35 U.S.C. 154(b) by 0 days.

(21) Appl. No.: 14/848,477

(22) Filed: Sep. 9, 2015

(65) Prior Publication Data

US 2016/0056223 A1  Feb. 25, 2016

Related U.S. Application Data

(63) Continuation of application No. 13/395,813, filed as application No. PCT/US2010/002519 on Sep. 16, 2010, now Pat. No. 9,165,989.

(60) Provisional application No. 61/242,955, filed on Sep. 16, 2009.

(51) Int. Cl.
  *H01L 27/32* (2006.01)
  *G01R 31/28* (2006.01)

(52) U.S. Cl.
  CPC .......... *H01L 27/3255* (2013.01); *G01R 31/28* (2013.01); *H01L 27/3225* (2013.01); *H01L 27/3248* (2013.01); *H01L 27/3276* (2013.01); *H01L 2227/323* (2013.01)

(58) Field of Classification Search
  CPC ............ H01L 27/3255; H01L 27/3276; H01L 27/3248
  See application file for complete search history.

(56) References Cited

U.S. PATENT DOCUMENTS

| | | |
|---|---|---|
| 5,550,066 A | 8/1996 | Tang et al. |
| 6,700,142 B1 | 3/2004 | Norman |
| 7,878,336 B2 | 2/2011 | Tsai et al. |
| 7,999,454 B2 * | 8/2011 | Winters ............. H01L 27/3248 313/500 |
| 8,115,380 B2 | 2/2012 | Cok et al. |
| 8,183,765 B2 * | 5/2012 | Cok ................... H01L 27/3248 313/483 |
| 2004/0032637 A1 | 2/2004 | Imamura |

(Continued)

OTHER PUBLICATIONS

International Search Report and Written Opinion, PCT/US2010/002519 mailed Jul. 20, 2011, 13 pages.

(Continued)

*Primary Examiner* — Jose R Diaz
(74) *Attorney, Agent, or Firm* — Myers Bigel, P.A.

(57) ABSTRACT

A large-format substrate with distributed control elements is formed by providing a substrate and a wafer, the wafer having a plurality of separate, independent chiplets formed thereon; imaging the wafer and analyzing the wafer image to determine which of the chiplets are defective; removing the defective chiplet(s) from the wafer leaving remaining chiplets in place on the wafer; printing the remaining chiplet(s) onto the substrate forming empty chiplet location(s); and printing additional chiplet(s) from the same or a different wafer into the empty chiplet location(s).

21 Claims, 13 Drawing Sheets

(56) References Cited

U.S. PATENT DOCUMENTS

| | | |
|---|---|---|
| 2005/0014308 A1 | 1/2005 | Tseng et al. |
| 2005/0170735 A1 | 8/2005 | Strip |
| 2006/0055864 A1 | 3/2006 | Matsumura et al. |
| 2006/0240578 A1 | 10/2006 | Oohata et al. |
| 2009/0130821 A1 | 5/2009 | Cox et al. |
| 2010/0015732 A1 | 1/2010 | Bose et al. |

OTHER PUBLICATIONS

International Preliminary Report on Patentability, PCT/US2010/002519 mailed Mar. 29, 2012, 9 pages.

* cited by examiner

300

HIGH-YIELD FABRICATION OF LARGE-FORMAT SUBSTRATES WITH DISTRIBUTED, INDEPENDENT CONTROL ELEMENTS

CLAIM OF PRIORITY

This application is a continuation of U.S. patent application Ser. No. 13/395,813 filed on May 25, 2012 which application is a 35 U.S.C. §371 national phase application of PCT International Application No. PCT/US2010/002519, entitled "High-Yield Fabrication Of Large-Format Substrates With Distributed, Independent Control Elements", having an international filing date of Sep. 16, 2010, which claims priority from U.S. Provisional Patent Application No. 61/242,955, filed on Sep. 16, 2009, in the United States Patent and Trademark Office, the disclosures of which are incorporated by reference herein in their entireties. The above PCT International Application was published in the English language and has International Publication No. WO 2011/034586 A2.

FIELD OF THE INVENTION

The present invention relates to large-format substrates with distributed, independent control elements and, in particular, to methods for fabricating such substrates with a high yield.

BACKGROUND OF THE INVENTION

Flat-panel display devices are widely used in conjunction with computing devices, in portable devices, and for entertainment devices such as televisions. Such displays typically employ a plurality of pixels distributed over a substrate to display images. Display devices are typically controlled with either a passive-matrix control employing electronic circuitry external to the substrate or an active-matrix control employing electronic circuitry formed directly on the substrate. Organic Light-Emitting Diode (OLED) display devices have been fabricated with active-matrix (AM) driving circuitry in order to produce high performance displays. An example of such an AM OLED display device is disclosed in U.S. Pat. No. 5,550,066. Active-matrix circuitry is commonly achieved by forming thin-film transistors (TFTs) over a substrate and employing a separate circuit to control each light-emitting pixel in the display.

In an active-matrix device, active control elements comprise thin-films of semiconductor material formed over a substrate, for example amorphous or poly-crystalline silicon, and distributed over a flat-panel display substrate. Typically, each display sub-pixel is controlled by one control element, and each control element includes at least one transistor. For example, in a simple active-matrix organic light-emitting (OLED) display, each control element includes two transistors (a select transistor and a power transistor) and one capacitor for storing a charge specifying the luminance of the sub-pixel. Each light-emitting element typically employs an independent control electrode and a common electrode. Control of the light-emitting elements is typically provided through a data signal line, a select signal line, a power connection and a ground connection. Active-matrix elements are not necessarily limited to displays and can be distributed over a substrate and employed in other applications requiring spatially distributed control.

The TFTs of an active-matrix display device may be composed of a thin layer (usually 100-400 nm) of a semiconductor such as amorphous silicon or polysilicon. The properties of such thin-film semiconductors are, however, often not sufficient for constructing a high-quality display. Amorphous silicon, for example, may be unstable in that its threshold voltage (Vth) and carrier mobility may shift over extended periods of use. Polysilicon often has a large degree of variability across the substrate in threshold voltage (Vth) and carrier mobility due to the crystallization process. Since OLED devices operate by current injection, variability in the TFTs can result in variability of the luminance of the OLED pixels and degrade the visual quality of the display. Compensation schemes, such as adding additional TFT circuitry in each pixel, have been proposed to compensate for TFT variability; however, such compensation may add complexity, which can negatively impact yield, cost, and/or reduce the OLED emission area. Furthermore, as thin-film transistor fabrication processes are applied to larger substrates, such as are often used for large flat-panel television applications, the variability and process cost may increase.

One approach to avoiding these issues with thin-film transistors is instead to fabricate conventional transistors in a semiconductor substrate and then transfer these transistors onto a display substrate. U.S. Patent Application Publication No. 2006/0055864 A1 by Matsumura et al. teaches a method for the assembly of a display using semiconductor integrated circuits (ICs) affixed within the display for controlling pixel elements, where the embedded transistors in the ICs replace the normal functions performed by the TFTs of prior-art displays. Matsumura teaches that the semiconductor substrate should be thinned, for example by polishing, to a thickness of between 20 micrometers to 100 micrometers. The substrate is then diced into smaller pieces containing the integrated circuits, hereafter referred to as 'chiplets'. Matsumura teaches a method of cutting the semiconductor substrate, for example by etching, sandblasting, laser-beam machining, or dicing. Matsumura also teaches a pick-up method where the chiplets are selectively picked up using a vacuum chuck system with vacuum holes corresponding to a desired pitch. The chiplets are then transferred to a display substrate where they are embedded in a thick thermoplastic resin.

The process taught by Matsumura, however, may have several disadvantages. For example, semiconductor substrates are typically 500 micrometers to 700 micrometers in thickness; therefore, thinning the substrate in this fashion may be difficult and, at low thicknesses, the crystalline substrate may be very fragile and may be easily broken. Therefore the chiplets may be very thick, at least 20 micrometers according to Matsumura. The thick chiplets of Matsumura may result in substantial topography across the substrate, which may make the subsequent deposition and patterning of metal layers over the chiplets more difficult. For example, Matsumura describes concave deformations as one undesirable effect.

Another disadvantage of the process taught by Matsumura is that the surface area of the chiplets must typically be large enough to be picked up by the vacuum-hole fixture. As a result, the chiplets may have a length and a width that are larger than the minimum size of the vacuum hole.

Employing an alternative control technique, Matsumura et al. describe crystalline silicon substrates used for driving LCD displays in U.S. Patent Application 2006/0055864. This application describes a method for selectively transferring and affixing pixel-control devices made from first semiconductor substrates onto a second planar display substrate. Wiring interconnections within the pixel-control device and connections from busses and control electrodes to the pixel-control device are shown.

In either of the above methods, there is a chance that chiplets deposited on a substrate may be misplaced, that the chiplets may be faulty, and/or that the chiplets may fail to be placed entirely. Moreover, subsequent substrate processing steps can damage the chiplets, inadvertently relocate the chiplets, and/or fail to interconnect chiplets properly. Such process failures can render the substrate completely or partially inoperable.

SUMMARY OF THE INVENTION

Some embodiments of the invention pertain to methods of making large-format substrate with distributed control elements. The method comprises:

a) providing a substrate and a wafer, the wafer having a plurality of separate, independent chiplets formed thereon; then b) imaging the wafer and analyzing the wafer image to determine which of the chiplets are defective; then c) removing the defective chiplet(s) from the wafer leaving remaining chiplets in place on the wafer; then d) printing the remaining chiplet(s) onto the substrate forming empty chiplet location(s); and then e) printing missing chiplet(s) from the same or a different wafer into the empty chiplet location(s).

According to further embodiments of the present invention, a method of fabricating integrated circuit elements on a receiving substrate includes providing a wafer having a plurality of chiplets thereon; determining that at least one of the chiplets on the wafer is defective; selectively removing the at least one of the chiplets from the wafer leaving remaining ones of the chiplets on the wafer; transferring the remaining ones of the chiplets from the wafer onto the receiving substrate to define at least one empty chiplet location on the receiving substrate; and transferring at least one additional chiplet onto to the at least one empty chiplet location on the receiving substrate.

In some embodiments, determining that the at least one of the chiplets is defective may include imaging the wafer to provide a wafer image and analyzing the wafer image to determine that the at least one of the chiplets is defective, and/or electrically testing the plurality of chiplets on the wafer to determine that the at least one of the chiplets is defective.

In some embodiments, the wafer may be a source wafer on which the plurality of chiplets were fabricated. The at least one additional chiplet may be transferred onto the at least one empty chiplet location on the receiving substrate from the source wafer, or from a different wafer.

In some embodiments, transferring the remaining ones of the chiplets onto the receiving substrate may include printing the remaining ones of the chiplets onto the receiving substrate in parallel.

In some embodiments, the receiving substrate may be imaged after transferring the remaining ones of the chiplets thereon to provide a substrate image, and the substrate image may be analyzed to determine the at least one empty chiplet location.

In some embodiments, the receiving substrate may be imaged after transferring the remaining ones of the chiplets or after transferring the at least one additional chiplet thereon to provide a substrate image, and the substrate image may be analyzed to identify that at least one of the chiplets on the receiving substrate is mis-located or defective.

In some embodiments, the receiving substrate may include an adhesive layer thereon. The at least one of the chiplets identified as mis-located or defective may be selectively removed from the receiving substrate before curing of the adhesive layer.

In some embodiments, the at least one of the chiplets identified as mis-located or defective may be selectively removed by providing a vacuum element operable to adhere the at least one of the chiplets identified as mis-located or defective by air pressure, and mechanically removing the at least one of the chiplets identified as mis-located or defective using the vacuum element.

In some embodiments, the at least one of the chiplets identified as mis-located or defective may be selectively removed by providing a gripping element operable to grip and mechanically remove the at least one of the chiplets identified as mis-located or defective, and mechanically removing the at least one of the chiplets identified as mis-located or defective using the gripping element.

In some embodiments, electrical connections may be formed to the remaining ones of the chiplets and the at least one additional chiplet on the receiving substrate to define a plurality of interconnected chiplets on the receiving substrate. It may be determined that at least one of the interconnected chiplets has a fault therein.

In some embodiments, determining that at least one of the interconnected chiplets includes the fault may include imaging the receiving substrate to provide a substrate image and analyzing the substrate image to determine that the at least one of the interconnected chiplets has the fault, and/or electrically testing the plurality of interconnected chiplets to determine that the at least one of the interconnected chiplets has the fault.

In some embodiments, the at least one of the interconnected chiplets having the fault therein may be selectively removed from the receiving substrate to define at least one second empty chiplet location on the receiving substrate.

In some embodiments, selectively removing the at least one of the interconnected chiplets having the fault therein may include removing material adhered to and surrounding the at least one of the interconnected chiplets having the fault therein, and then selectively removing the at least one of the interconnected chiplets having the fault therein. For example, the material adhered to and surrounding the at least one of the interconnected chiplets having the fault therein may be removed by laser ablation or by local chemical processing.

In some embodiments, the local chemical processing may be a photolithographic process, and the material may be removed by coating a photosensitive resin over the receiving substrate, and pattern-wise exposing and processing the photosensitive resin to form a locally chemically processable area over and around the at least one of the interconnected chiplets having the fault therein.

In some embodiments, at least one second chiplet may be printed into the at least one second empty chiplet location on the receiving substrate, and electrical interconnections may be formed to the at least one second chiplet.

In some embodiments, a second chiplet may be printed on the at least one of the interconnected chiplets having the fault therein on the receiving substrate, and electrical interconnections may be formed to the second chiplet. For example, an adhesive layer and/or a planarization layer may be provided on the at least one of the interconnected chiplets having the fault therein before printing the second chiplet thereon.

In some embodiments, the at least one of the chiplets that was selectively removed from the wafer may be printed onto a different adhesive substrate.

In some embodiments, a photosensitive adhesive layer may be provided on the receiving substrate prior to transferring the remaining ones of the chiplets to the receiving substrate; and
the adhesive layer may be selectively exposed at locations of the at least one of the chiplets identified as mis-located or defective to reduce adhesion between the receiving substrate and the at least one of the chiplets identified as mis-located or defective.

In some embodiments, the wafer may include a buried oxide layer having the plurality of chiplets thereon. A release etch of portions of the buried oxide layer may be performed to separate portions of the chiplets from the wafer prior to selectively removing the at least one of the chiplets determined to be defective.

In some embodiments, an OLED device may be formed on the receiving substrate. The OLED device may be configured to be controlled by the chiplets on the receiving substrate.

Other methods and/or devices according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

Figure 1:
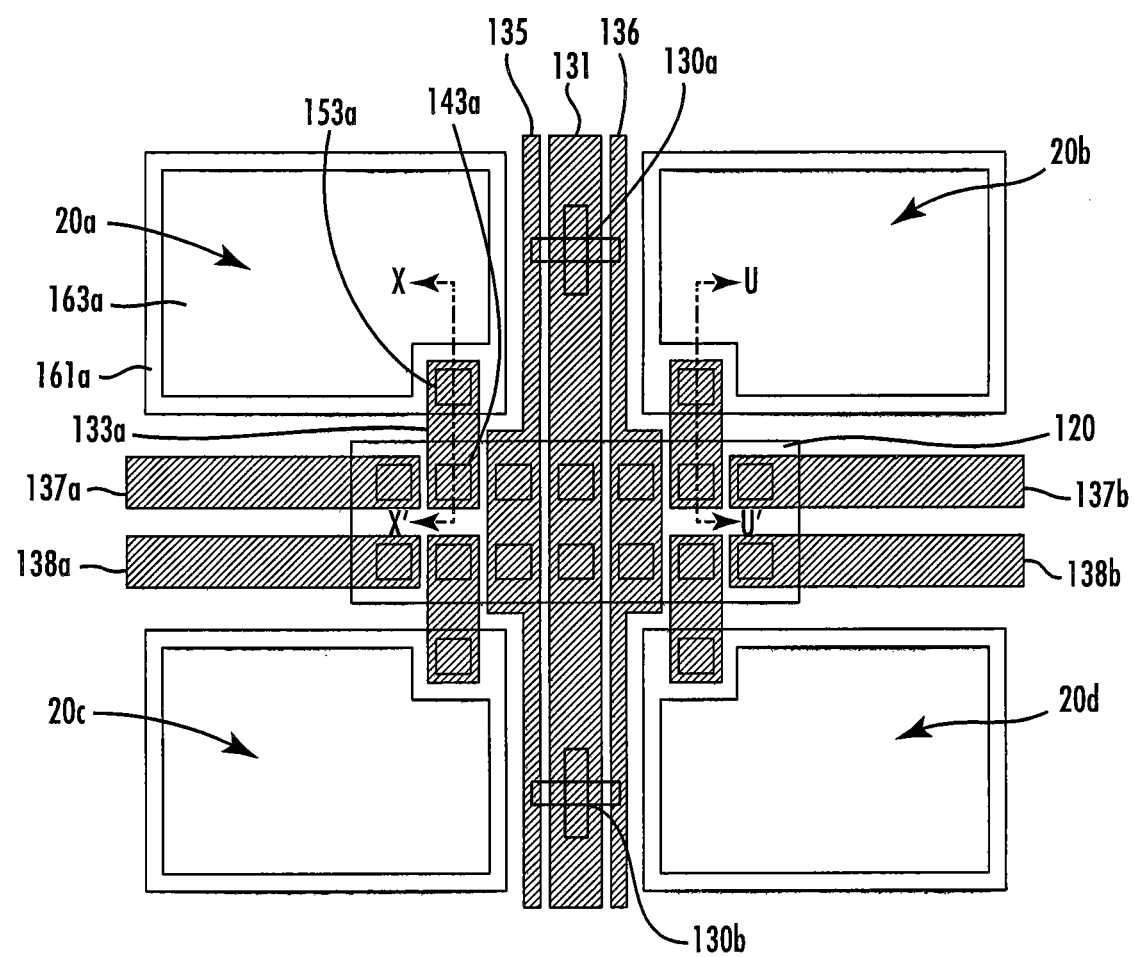
FIG. 1 is a layout view of four pixels of an OLED display.

The drawings described above in accordance with embodiments of the present invention are necessarily of a schematic nature, since layer thickness dimensions can be in the sub-micrometer ranges, while features representing lateral device dimensions can be in a range from 10 micrometers to a meter or more. Accordingly, the drawings are scaled for ease of visualization rather than for dimensional accuracy.

DETAILED DESCRIPTION OF EMBODIMENTS OF THE INVENTION

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entireties.

Reference is made herein to commonly assigned, co-pending U.S. application Ser. No. 12/191,478 and to U.S. patent application Ser. No. 11/145,574, the disclosures of which are incorporated by reference herein as if set forth in their entireties.

The present invention is directed to manufacturing methods for constructing a large-format substrates (generally referred to herein as receiving substrates) having multiple, independent control elements (also referred to herein as chiplets), where each control element includes a respective substrate that is separate and independent from the large-format substrate. In some embodiments,
it may be desirable that the chiplets have a thickness of less than 20 micrometers, and preferably less than 10 micrometers. Such thinner chiplets may reduce topography problems and facilitate formation of subsequent layers above the chiplets. It may also be desirable to include multiple metal wiring layers in the chiplet, and thus, the thickness of the semiconductor portion of the chiplet may be substantially thinner than the total thickness of the chiplet.

A general description of devices for controlling an OLED display according to some embodiments is first provided. In some embodiments, it may be desirable that the surface area of each chiplet is small enough to enable high-resolution displays and so that many chiplets can be produced on a single substrate, thereby enabling a low unit production cost. It may also be desirable that the shape of the chiplet be made to fit between pixels and not block light emission. Therefore, the chiplet may have a length or width that is narrow compared to the other dimension so that it can be placed in the spacing between the rows or the columns of pixels. After the device is described, methods according to some embodiments of the present invention are described.

FIG. 1 shows a layout view of a group of four pixel elements (20*a*, 20*b*, 20*c* and 20*d*) of an OLED display device. Each of the four pixels can be arranged to emit light of a different color, such as red, green, blue and white (RGBW) light. FIG. 1 represents a portion of a full display, where the full display would be constructed of an array of such groups of pixels arranged in many rows and columns. For example, a modern television would be constructed having 1920 rows and 1080 columns of such groups of pixels.

A chiplet 120 is arranged to control the electrical current to pixels 20*a*, 20*b*, 20*c* and 20*d*. A chiplet is a separately fabricated integrated circuit element that is mounted and embedded into the display device. Much like a conventional microchip (or chip), a chiplet is fabricated from a substrate and contains integrated transistors as well as insulator layers and conductor layers that are deposited and then patterned, for example, using photolithographic methods in a semiconductor fabrication facility (or fab). These transistors in the chiplet are arranged in a transistor drive circuit, as will be described in greater detail below, to drive the electrical current to pixels of the display.

A chiplet is smaller than a traditional microchip. Unlike traditional microchips, electrical connections may not be made to a chiplet by wire bonding or flip-chip bonding. Instead, after arranging and mounting each chiplet onto a receiving substrate, such as the display substrates described herein, deposition and photolithographic patterning of conductive layers and insulator layers continues on the receiving substrate. Therefore, the connections can be made relatively small, for example through using vias of about 2 to about 15 micrometers in size. The chiplet and connections to the chiplet are small enough to be placed within the area of one or more pixels which, depending on the display size and resolution, may range from approximately 50 micrometers to 500 micrometers in size. Additional details about such chiplets and related fabrication and mounting processes will be described below.

Figure 2A:
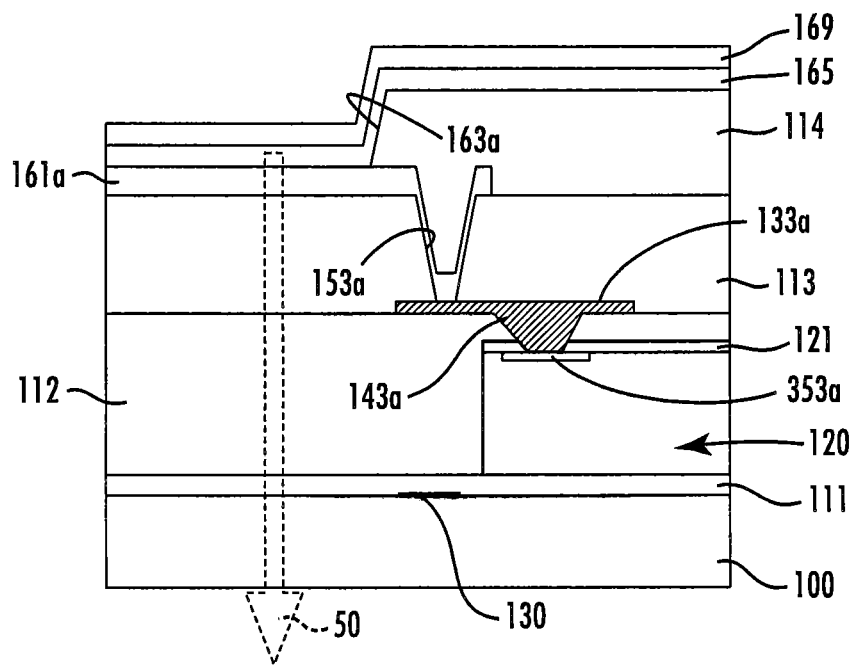
FIG. 2A is a cross-sectional view along line X-X' of the device of FIG. 1 in a pixel without a color filter.

Alignment marks 130*a* and 130*b* are provided on the display substrate 100 (called out in FIG. 2A). Preferably, to avoid reduction of the pixel emission area, these alignment marks 130*a*, 130*b* may be located under the display signal lines. Each of the pixels 20*a*, 20*b*, 20*c*, 20*d* is provided with a lower electrode, such as a lower electrode 161*a* in pixel 20*a*. The emitting area of pixel 20*a* is defined by an opening 163*a* in an insulator formed over the lower electrode. Multiple conductive elements may be formed in a first conductive layer, and may be arranged to facilitate providing electrical signals to the chiplet's transistor drive circuitry to enable the chiplet to control electrical current to the pixels. Chiplet 120 controls current to pixel 20*a* through a conductor 133*a*. For example, conductor 133*a* is connected to chiplet 120 through a via 143*a* and is also connected to lower electrode 161*a* through a via 153*a*.

The display device also includes a series of signal lines including, power lines, data lines, and select lines which are formed in the first conductive layer and transmit electrical signals from the edge of the display to the chiplets. Power lines are signal lines that provide a source of electrical current to operate the organic electroluminescent elements. Data lines are signal lines that transmit luminance information to regulate the luminance of each pixel. Select lines are lines that selectively determine which rows of the display are to receive luminance information from the data lines. As such, select lines and data lines may be routed in an orthogonal manner.

Power is provided to the chiplet 120 by way of a power line 131. Two vias are provided for connection between the power line and the chiplet 120. A data line 135 is provided in the column direction for communicating a data signal containing luminance information to chiplet 120 for pixel 20a and pixel 20c. Similarly, a data line 136 is provided in the column direction for communicating a data signal containing luminance information to chiplet 120 for pixel 20b and pixel 20d. In other embodiments, discussed in greater detail below, the data lines 135 and 136 and the power line 131 may be connected to the chiplet 120 by only a single via for each line. A select line segment 137a is provided in the row direction for communicating a row select signal to chiplet 120 for pixel 20a and pixel 20b. The row select signal is used to indicate a particular row of pixels and is synchronized with the data signal for providing luminance information. Thus the row select signal and the data signals are provided in orthogonal directions. Chiplet 120 communicates the row select signal from select line segment 137a to a select line segment 137b by way of an internal pass-thru connection on the integrated circuit. Select line segment 137b then communicates the row select signal to subsequent chiplets arranged in the same row. Similarly a select line segment 138a is provided in the row direction for communicating a row select signal to chiplet 120 for pixel 20c and pixel 20d. Chiplet 120 communicates the row select signal from select line segment 138a to a select line segment 138b by way of another internal pass-thru connection on the integrated circuit. Select line segments 137a and 137b together serve to form a single select line, which is physically discontinuous but electrically continuous. A connection between the select line segments is provided by the pass-thru connections in the chiplet. While only two segments are shown, the select line can contain a series of many such segments. Select line segments 138a and 138b similarly together serve to form a single physically discontinuous but electrically continuous select line. In some embodiments of the present invention, all of the select lines segments and data lines may be formed from a single metal layer. Communication across the orthogonal array may be achieved by routing the row select signal, the data signal, or both through the pass-thru connections on the chiplet.

FIG. 2A shows a cross sectional view of the OLED display device of FIG. 1 taken along line X-X', where pixel 20a is a white pixel, and thus does not include a color filter. The display device is constructed over a display substrate 100. Alignment marks 130 are defined on the display substrate 100. One approach for defining these alignment marks is to photo-lithographically define patterns in a metal layer having a thickness of less than about 100 nm. Over the display substrate 100, an adhesive layer 111 is provided. One material that may be used for adhesive layer 111 is Benzocyclobutene (BCB), which may be formed by spin coating to thickness of approximately 0.5 to approximately 10 micrometers. Chiplet 120 is placed on the adhesive layer 111. The chiplet has a thickness (H) that is may be less than about 20 micrometers and, in some embodiments, less than about 10 micrometers. Planarization layer 112 is provided to reduce the topography around chiplet 120 and facilitate continuous formation of a subsequent conductive layer. A planarization layer 112 may be formed at a thickness greater than the thickness (H) of the chiplet 120. A material that may be used for planarization layer 112 is Benzocyclobutene (BCB) formed by spin coating. It may be advantageous to use the same material for the adhesion layer 111 and the planarization layer 112 in some embodiments so as to reduce differences in refractive index that can cause optical reflections at the interface of these two layers. Therefore by using the same material, the refractive index of the adhesion layer 111 and the planarization layer 112 layers may be the same.

Via 143a is opened in the planarization layer 112 and an optional insulator sub-layer 121 on chiplet 120 to provide access to a connection pad 353a. Formation of this via can be done using photolithography techniques and is facilitated if a photo-imagable BCB compound is used for planarization layer 112. Chiplet 120 is mounted over substrate 100 such that the connection pads, such as connection pad 353a, are facing upward. The arrangement may be referred to as a "pad-up" configuration. In particular, the transistor circuitry in the chiplet (not shown) is disposed between the connection pads and the substrate 100. This arrangement may be advantageous in that it provides convenient access to the connection pads for subsequent wiring layers.

Over planarization layer 112, a conductor layer (or wiring layer) is formed. This conductor layer may be patterned using conventional photolithography techniques into the select lines, data lines, and power lines, as well as the connectors between the chiplets and the anodes, such as conductor 133a. Electrical connection between the conductor layer and the chiplet 120 can then be readily made through vias, such as via 143a. This enables high quality, reliable electrical connectivity. Since the current to the pixels is provided by the wiring layer, this layer may be constructed to have low resistance. In this regard, materials for the wiring layer may include aluminum or aluminum alloys formed to a thickness of approximately 200 to approximately 500 nm.

Over this wiring layer, an insulator layer 113 is formed. Vias, such as via 153a, provide for connection to the wiring layer from above. Lower electrode 161a is provided over insulator layer 113. In this bottom emitter configuration, lower electrode 161a is formed to be at least partially transparent. Materials that may be used for the lower electrode 161 include transparent conductive oxides such as Indium Tin Oxide (ITO) or Aluminum doped Zinc Oxide (AZO) or the like. Thin metals such as less than about 25 nm of aluminum, silver, or the like can also be used. Over the edges of lower electrode 161a, an insulator layer 114 is formed. This insulator layer 114 can be constructed, for example, of a photo-patterned polymer and serves to prevent high electric fields at the edges of the lower electrode 161a. Similar insulator layers for this purpose are described in U.S. Pat. No. 6,246,179. Opening 163a is provided in the insulator layer to provide for contact to the lower electrode 161a.

Above lower electrode 161a, an organic electro-luminescent medium 165 is formed. There are many such different organic electro-luminescent media configurations known in the art. Although the organic electro-luminescent medium 165 is shown as a single layer, it may include a plurality of sub-layers such as a hole transporting sub-layer and an electron transporting sub-layer. Organic electro-luminescent medium 165 can include additional sub-layers such as hole injecting sub-layers, electron injecting sub-layers, and/or specialized light emitting sub-layers. For the organic electro-luminescent media 165, a broadband (or white) light source which emits light at various wavelengths used by all of the differently colored pixels may be used in some embodiments to avoid the need for patterning the organic electro-luminescent media between light producing units. Colored pixels may be achieved by aligning color filter elements with light producing elements. Some examples of organic electro-luminescent (EL) media layers that emit broadband or white light are described, for example, in U.S. Pat. No. 6,696,177. However, embodiments of the present invention can also be made to work where each pixel has one or more of the organic electro-luminescent media sub-layers separately patterned for each pixel. The organic EL media may be constructed of several sub-layers such as; a hole injecting sub-layer, a hole transporting sub-layer that is disposed over the hole injecting sub-layer, a light-emitting sub-layer disposed over the hole transporting sub-layer, and an electron transporting sub-layer disposed over the light-emitting sub-layer. Alternate constructions of the organic electro-luminescent media 165 having fewer or more sub-layers can also be used in some embodiments of the present invention.

Over organic electro-luminescent medium 165, an upper electrode 169 is formed. Although shown as a single layer, upper electrode 169 can also include a plurality of sub-layers. Several upper-electrode configurations are known in the art. For example, the upper electrode 169 may include a sub-layer of Li or LiF approximately 0.5 nm thick in contact with the organic electro-luminescent medium 165 for facilitating electron injection followed by a sub-layer of Al approximately 100 to approximately 400 nm thick. Other features such as a moisture barrier encapsulation (not shown) or desiccant (not shown) used in the art of fabricating OLED devices can also be included. Current flow between the lower electrode 161a and the upper electrode 169 through the organic electro-luminescent medium 165 results in light emission 50.

Figure 2B:
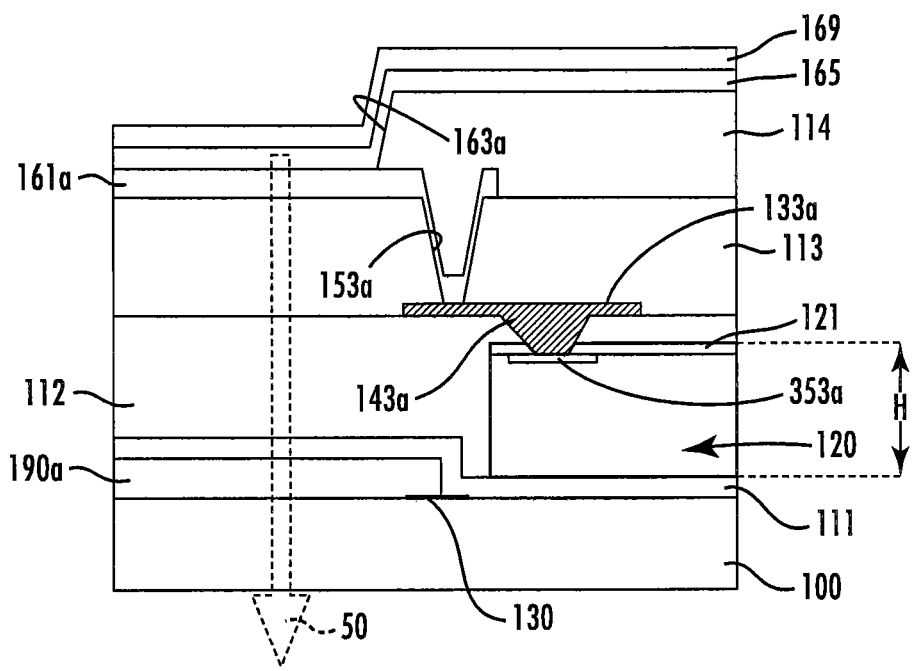
FIG. 2B is a cross-sectional view along line U-U' of the device of FIG. 1 in a pixel where a color filter is used.

FIG. 2B shows a cross-sectional view of the OLED display device of FIG. 1 along line U-U', where pixel 20b has a color filter. The color filter 190a is placed under the light emitting area, and can be deposited before the adhesive layer 111 as shown. In other embodiments, the color filter can be placed on top of the adhesive. For an RGBW type display, the white pixels can be constructed without color filters. Color filters can be formed by methods such as spin coating and are approximately 1 to approximately 3 micrometers in thickness. In some embodiments, the color filter may be placed under the planarization layer 112 so that the planarization layer serves to planarize both the color filters and the chiplet 120. The color filters may be formed prior to mounting the chiplets. Since the chiplets are relatively thick, their presence can impair proper spin coating of the color filters, so that device performance and yield are enhanced by stamping the chiplets after forming the color filters. Furthermore, the color filter process can be inspected and defective devices discarded prior to placing the chiplets so as to reduce the chance of wasting chiplets, thereby reducing overall production cost.

Figure 3A:
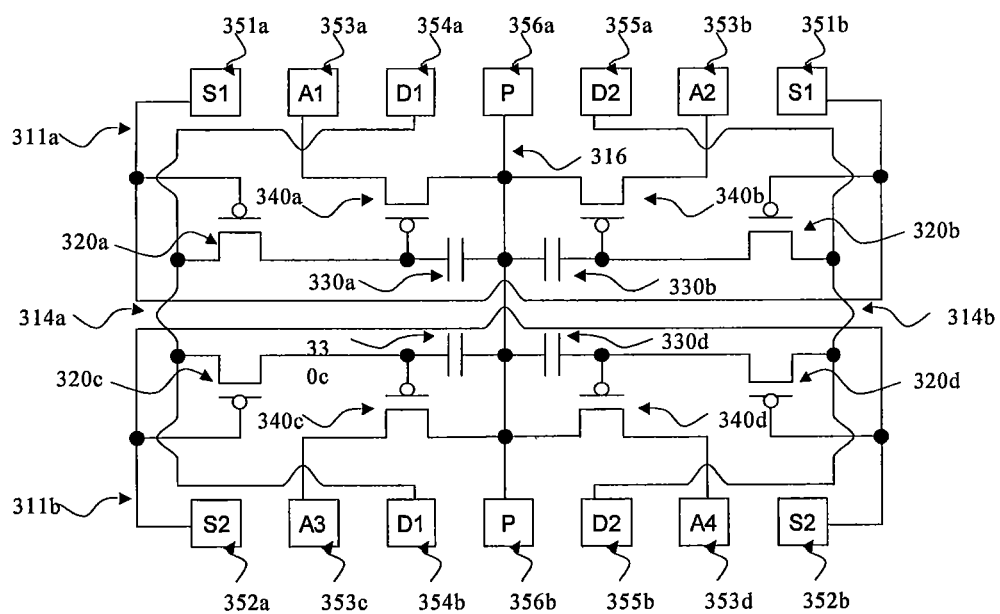
FIG. 3A is a circuit schematic of the integrated circuit chiplet.

FIG. 3A illustrates a schematic drawing of an integrated circuit 300 provided on each chiplet according to embodiments of the present invention. Integrated circuit 300 is arranged to drive four independent OLED pixel elements. Integrated circuit 300 includes four select transistors (320a, 320b, 320c and 320d), four storage capacitors (330a, 330b, 330c and 330d) and four drive transistors (340a, 340b, 340c and 340d). Other circuits with more or fewer components can also be employed. These components are connected to several connection pads arranged in two rows including connection pads 351a, 351b, 353a, 353b, 354a, 355a and 356a arranged in a first row and connection pads 352a, 352b, 353c, 353d, 354b, 355b and 356b arranged in a second row. Connection pads 353a, 353b, 353c and 353d are provided for connection to the lower electrode (anode) of the organic light emitting diode element of each pixel. These connection pads are electrically connected to drive transistors 340a, 340b, 340c and 340d respectively. Connection pads 356a and 356b are arranged for connection to an external power supply line, are electrically connected by pass-thru connection 316 and are electrically connected to all of the drive transistors 340a, 340b, 340c and 340d. Connection pads 351a and 351b are arranged for connection to a first external select line, are electrically connected by a pass-thru connection 311a and are electrically connected to the gates of select transistors 320a and 320b. Connection pads 352a and 352b are arranged for connection to a second external select line, are electrically connected by pass-thru connection 311b and are electrically connected to the gates of to select transistors 320c and 320d. Connection pads 354a and 354b are arranged for connection to a first external data line, are electrically connected by a pass-thru connection 314a and are electrically connected to select transistors 320a and 320c. Connection pads 355a and 355b are arranged for connection to a first external data line, are electrically connected a by pass-thru connection 314b and are electrically connected to select transistors 320b and 320d.

In order for the external select lines to address the rows of pixels of the display and the external data lines to address the columns of the display, these lines may be arranged in an orthogonal pattern. It may be desirable that these external lines be formed from a single metal layer to avoid additional manufacturing steps. This may be achieved by routing either the data signal or the select signal through the pass-thru connections on the chiplet. In the case shown, the select signals, the data signals, and the power signal are all provided with pass-thru connections. The external select lines are discontinuous and require the pass-thru connections to complete the connection. The external data lines and power lines, however, are continuous. In this case, providing two connection pads with a pass-thru connection for each of the two data signals and power signals has an advantage of redundancy. That is, if one of the connections between the connection pad and the external data lines or the external power lines is not fully formed or is otherwise incomplete, the device will continue to function.

Figure 3B:
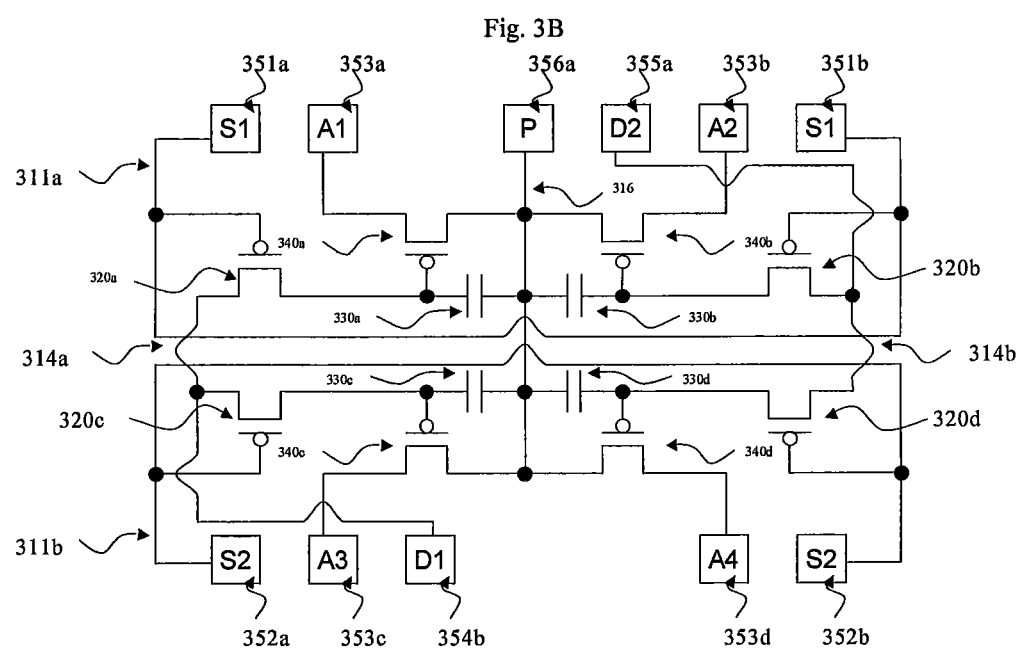
FIG. 3B is a circuit schematic of the integrated circuit chiplet.

In other embodiments of the present invention, pass-thru connections can be provided for only the select signal and not the data signal or vice versa. The pass-thru connection for the power signal can also be optionally eliminated. In addition to removing the pass-thru connections, one of the two connection pads associated with each of the removed pass-thru connections can also be removed. One such alternate embodiment is shown in FIG. 3B. The embodiment of FIG. 3B provides an advantage that surface area of the chiplet needed for circuitry and connection pads may be reduced. However, this alternate embodiment may not offer the advantage of redundant connections for the data signal and power signal.

FIG. 1 to FIG. 3B show embodiments where the chiplet drives four pixels, and where the four pixels respectively emit red, green, blue, and white light. In an other embodiments, the chiplet could drive a different number of pixels, for example eight, twelve or sixteen pixels. For example, a chiplet controlling sixteen pixels including 4 red, 4 green, 4 blue and 4 white sub-pixels can be constructed. The chiplet may drive an equal number of each different color sub-pixels, such as N red sub-pixels, M green sub-pixels, P blue sub-pixels, and Q white sub-pixels where N=M=P=Q, and where N is an integer equal to 2 or more. Since each differently colored pixel can require different driving currents due to different color efficiencies, the transistor design (such as the channel ratio of the channel width to channel length) can be separately improved or optimized for each different color. Thus there is an advantage in display designs where each chiplet drives an equal number of pixels of each color such that all chiplets can be made the same. Such arrangements also facilitate the placing of the chiplets symmetrically within the display area.

Figure 4:
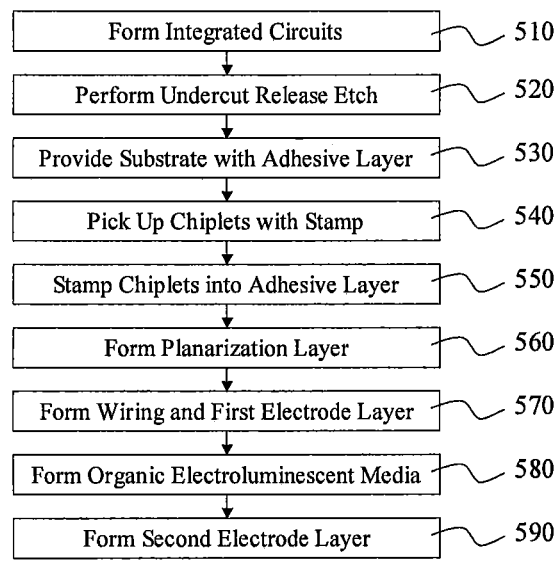
FIG. 4 is a flowchart illustrating a process for forming a OLED display with chiplet driving circuitry.

FIG. 4 is a block diagram describing the process steps for making an OLED display. The process 500 begins with step 510 by forming integrated circuit elements. These integrated circuit elements are arranged in a configuration to drive one or more pixels of the OLED display. The integrated circuit elements may be formed from a silicon-on-insulator type (SOI) substrate using known integrated circuit fabrication techniques. SOI substrates include a crystalline silicon layer formed over an insulator layer, such as silicon dioxide, which is in turn formed over a bulk crystalline silicon wafer. The silicon dioxide layer is commonly referred to as the "buried oxide" or "BOx". SOI wafers may be fabricated by bonding a first silicon wafer with a silicon dioxide layer to a second silicon wafer, followed by cleaving or thinning the second silicon wafer such that a thin film of crystalline silicon remains over the silicon dioxide layer. Such SOI wafers are commercially available from a variety of suppliers. A substrate used for forming the integrated circuit for the chiplets may generally be referred to as an "integrated circuit substrate".

Figure 5:
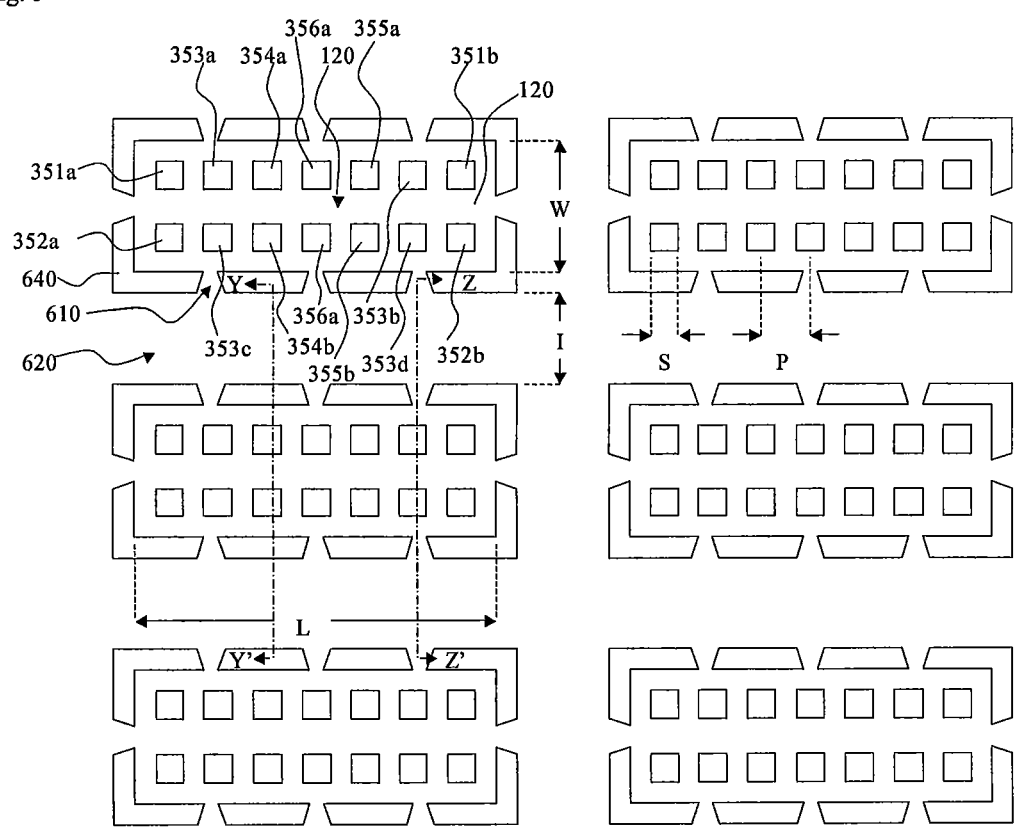
FIG. 5 shows a partial layout view of a wafer containing chiplets prior to picking up the chiplets.
Figure 6A:
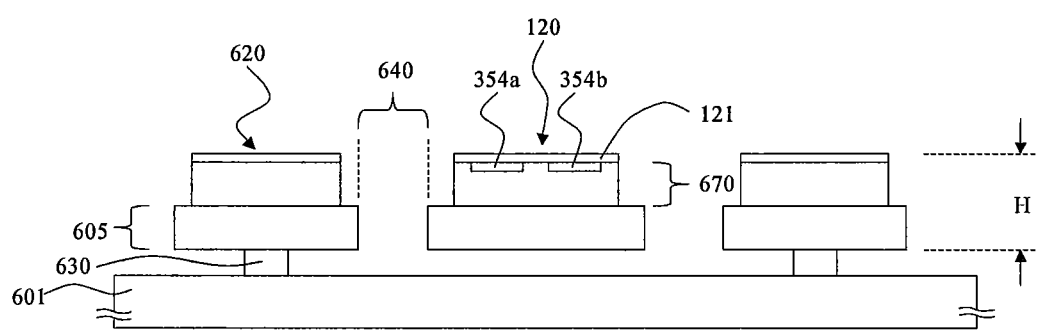
FIGS. 6A and 6B are cross sectional views along lines Y-Y' and Z-Z' of FIG. 5, respectively.
Figure 6B:
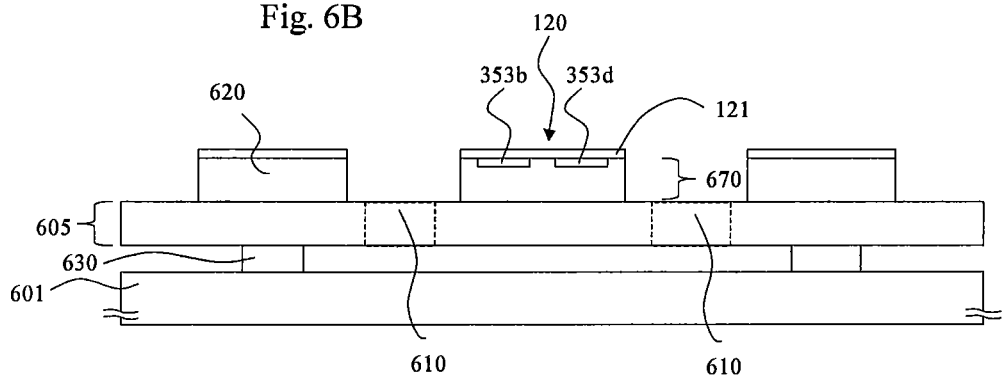

In step 520, a release etch is performed to partially separate the chiplets from the integrated circuit substrate. This step is further illustrated in the layout view of the chiplet partially attached to the integrated circuit substrate shown in FIG. 5 and in cross sectional views of FIG. 6A and FIG. 6B. FIG. 6A is a cross sectional view from FIG. 5 taken along line Y-Y' and FIG. 6B is a cross sectional view from FIG. 5 taken along line Z-Z'. Chiplet 120 is formed from an integrated circuit substrate which is of the silicon on insulator type. The silicon on insulator substrate consists of a semiconductor layer 605, which may be less than about 10 micrometers in thickness and, in some embodiments, between about 0.05 and about 5 micrometers in thickness, separated from an integrated circuit substrate bulk 601 by a buried oxide with a thickness of between about 0.1 to about 3.0 micrometers. In the area of the chiplet, the semiconductor layer 605 contains the semiconductor portions, including doped regions and wells, used in forming the source and drain regions of the transistors. Over the semiconductor layer 605, circuitry layers 670 are formed that contain chiplet-conductor sub-layers, such as a chiplet-conductor sub-layer for forming gate electrodes and one or more chiplet-conductor sub-layers serving to form electrical connections between the transistors. Circuitry layers 670 include the connection pads, such as connection pads 353b, 353d, 354a and 354b formed in one of chiplet-conductor sub-layer.

Figure 7:
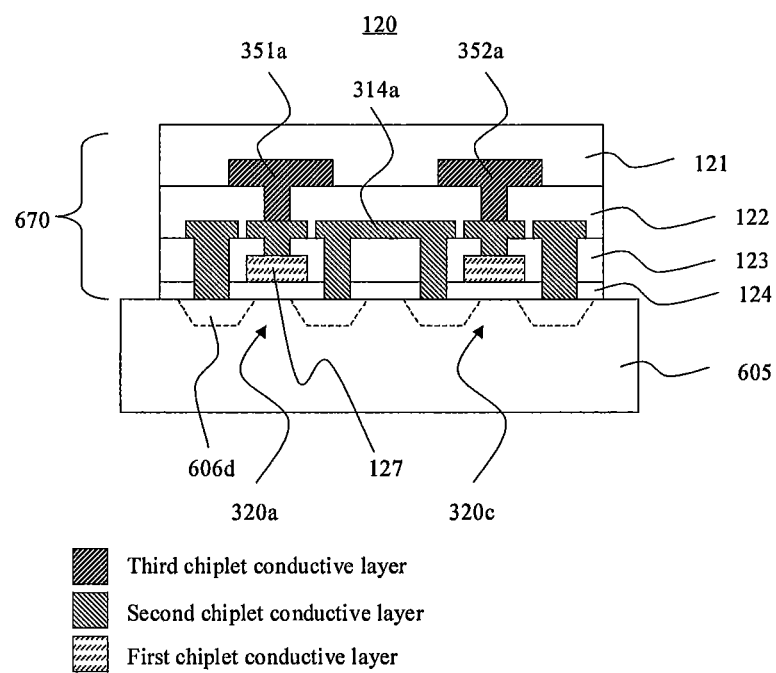
FIG. 7 is a detailed cross-sectional view of a chiplet.

The circuitry layers 670 and semiconductor layer 605 are further illustrated in the cross-sectional view of the chiplet 120 shown in FIG. 7. The circuitry layers 670 also include several insulator sub-layers such as a gate insulator sub-insulator 124 and interlayer insulator sub-layers 123, 122, and 121. These insulator sub-layers can be constructed of materials such as silicon dioxide or other known insulator materials. The chiplet also includes a plurality, of chiplet-conductor layers. The first chiplet-conductor layer is arranged to form gate, electrodes, such as a gate electrode 127. Doped regions in semiconductor layer 605, such as a doped region 606d, form source and drain regions of transistors corresponding to the gate electrodes. A second chiplet conductor layer is provided for forming connections between transistors, such as the pass-thru connection 314a. The connection pads, such as connection pads 351a and 352a, may be formed in a third chiplet-conductor layer. This configuration permits efficient layout of the wiring in the second chiplet-conductor layer while permitting dense packing of connection pads in the third chiplet-conductor layer. However, in other embodiments, fewer or more chiplet-conductor layers can be employed. The thickness of the circuitry layers 670 may depend on the number of chiplet-conductor sub-layers, and may be between about 1 micrometer and about 15 micrometers. The total thickness of the chiplet (H) includes a combination of the thickness of the semiconductor layer 605 and the circuitry layers 670, and may be less than 20 micrometers in some embodiments.

Turning back to FIGS. 6A and 6B, trenches, such as trench 640, are formed around each chiplet, such as chiplet 120. These trenches are etched through the semiconductor layer 605, exposing the buried oxide layer. Anchor areas, such as anchor area 620, are provided between chiplets. The chiplets are attached to the anchor areas by small micro-bridges, such as micro-bridge 610, as described in U.S. patent application Ser. No. 11/421,654. Prior to forming the trenches, a protection layer (not shown) of a material such as a photo-resist or silicon nitride layer is formed over the integrated circuitry as described in U.S. Patent Application Publication No. 2008/0108171. A release etch is then performed using an etchant such as hydrofluoric acid (HF) to remove the portion of the buried oxide layer disposed under the chiplet and micro-bridges, leaving buried oxide portions 630 under the anchors. In some embodiments, the release etch may be performed as described in U.S. patent application Ser. No. 12/732,868, the disclosure of which is incorporated by reference herein. The protection layer can then removed, exposing the chiplet connection pads. Chiplet 120 has a width (W) and length (L) (as shown in FIG. 5). The anchor area 620 has a width (I) that is greater than W in some embodiments to permit the buried oxide to be completely removed from under the chiplet while not completely etching the buried oxide under the anchor, so as to define the buried oxide portions 630.

Turning back to FIG. 4 with elements additionally referenced from FIGS. 2A and 5, adhesion layer 111 is applied to the display substrate 100 in step 530. The adhesion layer may be BCB or other common photo-resist materials as described above. The adhesion layer 111 may be photosensitive.

Figure 8:
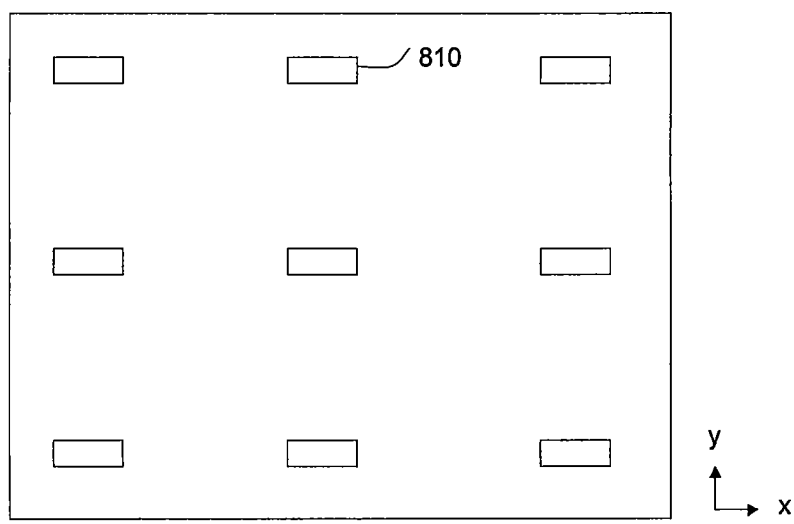
FIG. 8 is a plan view of the stamp used to pick up and transfer the chiplets.
Figure 9:
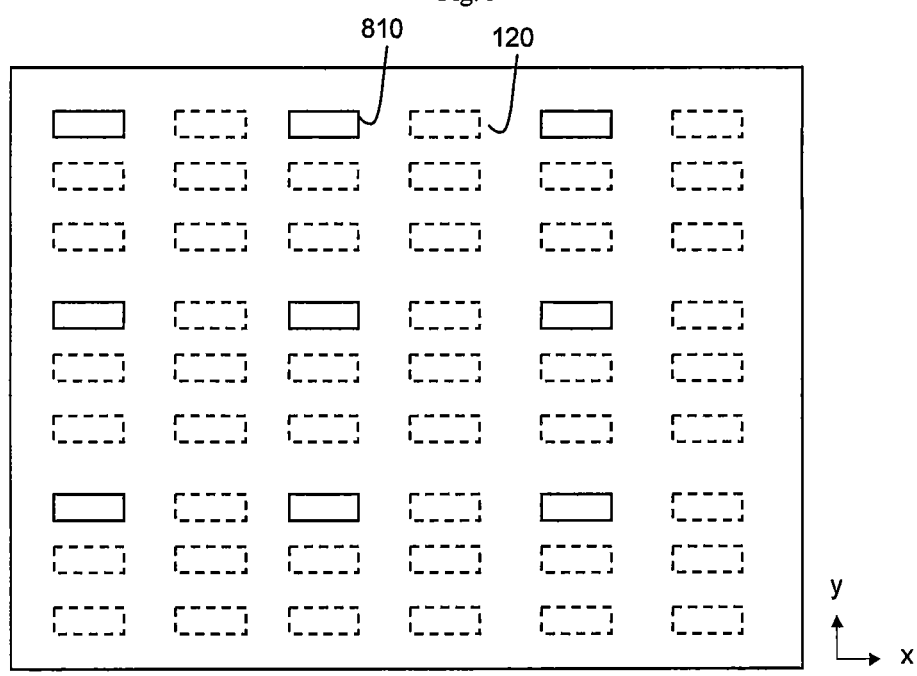
FIG. 9 is a plan view of the chiplet stamp over the chiplets on the semiconductor substrate.

The chiplets are picked up in step 540 with a stamp, for example, as described in U.S. patent application Ser. No. 11/145,574. The stamp may be constructed of a conformable material, such as poly(dimethyl siloxane) (PDMS), that has its undersurface formed into posts. An example stamp 800 is shown in FIG. 8. Stamp 800 includes a variety of raised posts, such as post 810. The spacing of the posts is predetermined to be a geometric multiple (integer or integer ratio) of the spacing of the chiplets on the integrated circuit substrate as well as the pixels spacing on the display substrate. For example, the alignment of the stamp to the chiplets to the integrated circuit substrate is shown in FIG. 9, where the posts correspond to every second chiplet (such as chiplet 120) in the x-direction and every fourth chiplet in the y-direction. The posts on the stamp pad can pick up a portion of the chiplets simultaneously in one stamping operation. Multiple stamping operations can then be used to populate the entire display substrate with chiplets. This has the advantage that, due to the area of high utilization efficiency of the integrated circuit substrate area, the integrated circuit substrate area can be much smaller than the area of the display.

In the pickup operation, the stamp is aligned so the posts 810 are located over the chiplets 120. The chiplets are then quickly detached from the silicon on insulator substrate. As described in U.S. patent application Ser. No. 11/423,192, kinetic control of the adhesion forces between the stamp and the chiplets enable the controlled fracture of the supporting micro-bridges 610. The van der Waal's force between the stamp and the chiplet causes the chiplets to remain in contact with the stamp after the micro-bridges are broken. This method of picking up the chiplets enables the chiplets to be very small in area. For example, a chiplet with length or width dimensions of about 50 micrometers or less can be picked up using this method. Such dimensions are difficult to achieve using a vacuum suction apparatus, as the vacuum suction opening must be smaller than the chiplet dimension. This technique also permits large arrays of such chiplets to be simultaneously transferred while maintaining good dimensional spacing and alignment between the chiplets.

In step 550, the stamp with the chiplets is aligned to the target alignment marks 130 on the display substrate 100 and lowered so the chiplets 120 are in contact with the adhesion layer 111, thereby printing the chiplets 120 onto the display substrate 100 in parallel. In other words, multiple chiplets 120 are transferred to the display substrate 100 substantially simultaneously. The bond with the adhesive is stronger than the van de Waal's force so the chiplets remain on the display substrate. The stamp is then withdrawn, leaving the chiplets adhered to the display substrate. The adhesive can then be cured. Optionally, the adhesive can also be removed in areas not under the chiplet. At this stage the chiplets are effectively mounted to the display substrate.

In step 560, the planarization layer 112 is applied to the substrate, covering the chiplets. The BCB layer may be greater in thickness than the chiplets, which may be beneficial in reducing overall topography (variations in surface height) on the display substrate. The planarization layer is patterned to open the vias, such as via 143a over the chiplet as described above. In some embodiments, the planarizing material is itself a photo resist material, such as photoimagable BCB, that can also be used as a mask to permit etching of the insulating sub-layer 121 on the chiplet 120 in order to expose the metal connection pads, such as connection pad 353a in the chiplet. At this stage, the chiplet is effectively embedded in the display device.

In step 570, a conductor layer is deposited over top of the planarization layer, and the metal layer is patterned to form wires. Standard photolithography methods and etching can be used to pattern the wires. Alternatively, the metal layer can be deposited in a pattern-wise fashion using methods such as ink jet deposition of silver nano-particles.

In the case of a bottom emission OLED display, a transparent lower electrode 161a is used. One approach to forming such a patterned electrode is to deposit another insulator layer 113 of photoresist and to open vias therein for connection to the underlying metal layer, e.g. 153a. The transparent lower electrode 161a is then deposited, for example by sputtering, using a common transparent conductive oxide such as ITO or IZO. This may be patterned using standard etching methods. Alternative transparent electrode materials may be used including conductive polymeric materials such as PDOT/PSS copolymers. In an alternative embodiment of a top-emission display, the patterned conductor layer could be used to form the reflective lower electrodes, eliminating the need for a separate conductor layer and interlayer insulator layer 113.

The emission areas of each pixel are defined by openings 163a in insulator layer 114 that can be formed of a photoimagable material.

In step 580, the electro-luminescent (EL) media 165 is formed. In some embodiments these are small molecule materials and a typical EL stack contains layers for hole injection, hole transport, recombination and light emission, electron transport and electron injection. Multiple EL stacks can also be used with connecting layers. One method of forming the organic electro-luminescent media layers is by evaporation from a crucible or linear evaporation source. Alternatively these materials can be polymeric and deposited by methods known in the art such a spin coating or inkjet coating.

In step 590, the upper electrode 169 is formed. In some embodiments this electrode is not patterned in the pixel area, but rather is continuous and electrically common across all the pixels. The upper electrode can be deposited by evaporation or sputtering. For a bottom-emitting configuration, materials may include aluminum, a stack of aluminum over lithium or lithium fluoride, or magnesium silver alloys. In an alternate top emitting embodiment, the upper electrode can be made to be transparent using materials such as transparent conductive oxides (like ITO) or thin metals (such as less than 25 nm of aluminum or silver). The circuit in the chiplet serves to regulate the current flowing vertically through the OLED stack between lower electrode 161a and upper electrode 169, producing the light emission 50 at desired intensities.

FIG. 5 shows a plan view of the chiplets 120 on the mother wafer, also referred to herein as a source wafer, prior to pickup in step 540. After etching to release the chiplets in step 520, the chiplets remain attached by micro-bridges 610. The rows of chiplets are separated by the anchor area 620 that remain attached to the substrate below the etched layer. A cross section of the chiplet through Y-Y' in FIG. 5 is shown in FIG. 6A and a cross section through Z-Z' is shown in FIG. 6B. The buried oxide portion 630 is completely removed from under the chiplet 120 but partially remains under the anchor area. The micro-bridges 610 mechanically support the chiplet after the etching is complete.

As previously described and further illustrated in FIG. 5, each chiplet has connection pads arranged in two rows including connection pads 351a, 351b, 353a, 353b, 354a, 355a and 356a arranged in a first row and connection pads 352a, 352b, 353c, 353d, 354b, 355b and 356b arranged in a second row. The rows are arranged parallel to the length (L) direction. It is desirable that the width (W) be made small in order to facilitate the release etch. Therefore the chiplet may be constructed with either one or two rows of vias. The transistor and wiring circuitry within the chiplet can be fabricated using currently available semiconductor patterning technology. For example, semiconductor fabrication facilities can process feature sizes of about 0.5 micrometers, about 0.35 micrometers, about 0.1 micrometers, about 0.09 micrometers, about 0.065 micrometers, or smaller. The size of the pads, however, may be determined by the alignment and feature sizes of the metallization layers formed on the display substrate, and may be relatively large. For example, line, space, and via sizes of about 5 micrometers with alignment accuracies of +/−5 micrometers would be compatible with chiplet connection pads that are 15 micrometers on a side (S) and spaced at 20 micrometers in pitch (P). Therefore, in some embodiments of the invention, the overall size of the chiplet may be dominated by the size and arrangement of the connection pads. It is desirable that the size of the chiplet be made small so that many chiplets can be made simultaneously on the same integrated circuit substrate.

The connections to the chiplets made on the display substrate are shown in FIG. 1. It is desirable that the surface area of the display substrate covered by the chiplet and the wiring be made small so that the surface area of the pixels available for emission is large. In order to facilitate the connections to the chiplet while keeping the surface area of the wiring small, the arrangement of the connection pads on the chiplets is specifically selected. For example, the connection pads associated with the select line segments (137a, 137b, 138a, 138b) are arranged at the ends (first and last) of each row of connections pads. This may avoid the need to bend the select line segments, which can then be made small.

The data lines 135 and 136 are routed in a direction perpendicular to that of the select lines segments. In the arrangement shown in FIG. 1, the data lines pass over the chiplet 120 in a continuous fashion. As such, it is desirable that the chiplet 120 be arranged so that its shorter width (W) dimension is aligned parallel to direction of the data lines. The longer length (L) direction is therefore aligned parallel to the select lines. The power line 131 is also routed in a continuous fashion in a direction perpendicular to that of the select lines segments and parallel to the shorter width (W) dimension of the chiplet 120. These layout arrangements result in a large portion of the area of the chiplet under the signal lines being that of the connection pads, and reduce wasted non-connection pad areas covered by the signal lines so that the chiplet can be made small and the surface area of the display substrate covered by the chiplets can also be made small. In some embodiments, the power line may be arranged so as to be centered over the chiplet as shown to simplify wiring to the pixels on each side of the power line.

Figure 10:
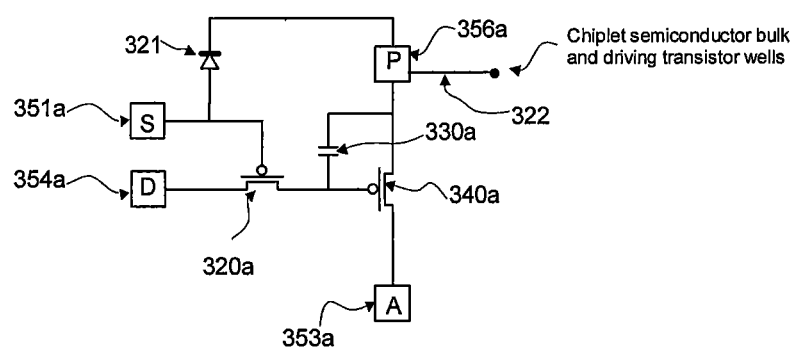
FIG. 10 shows an electrostatic damage prevention circuit diagram.

A pixel drive circuit of an alternate embodiment useful for protecting against electrostatic damage is shown in FIG. 10. Multiple pixel drive circuits can be included on the chiplet to drive multiple pixels. The pixel drive circuit includes a drive transistor 340a, a select transistor 320a, a storage capacitor 330a and a diode 321 for electrostatic discharge (ESD) protection. In the configuration shown, all the transistors are p-MOS, and only a single power connection pad 356a is used. If CMOS transistors are used, then another power connection may be required, which may add additional wiring in the panel. The power connection pad 356a is connected to the doped well regions of the semiconductor bulk corresponding to transistors 320a and 340a and also to the semiconductor bulk of the chiplet through connections 322. The ESD diode 321 is connected to connection pad 351a and power connection pad 356a. It provides protection for the gate of select transistor 320a from voltage transients in manufacturing of the chiplet, during printing of the chiplet, during manufacturing of the display and during operation. Although the methods of the present invention have been described above with respect to OLED devices, devices made according to embodiments of the present invention are not limited thereto.

As discussed above, the process described and illustrated in FIG. 4 can fail. For example, the chiplets may include a material on the chiplet surface that prevents good adhesion with the stamp, the chiplets may not be completely released from the wafer, and/or chiplets may be lost between pick up and placement on the substrate. Moreover, chiplets may be misplaced or misaligned on the substrate, either in location or orientation, due to mechanical disturbances and/or tolerances in the printing process. After the chiplets are printed, the process of interconnecting the chiplets, typically using conventional coating and photolithographic processes, can fail, as such photolithographic processes may not have perfect yields.

Figure 11:
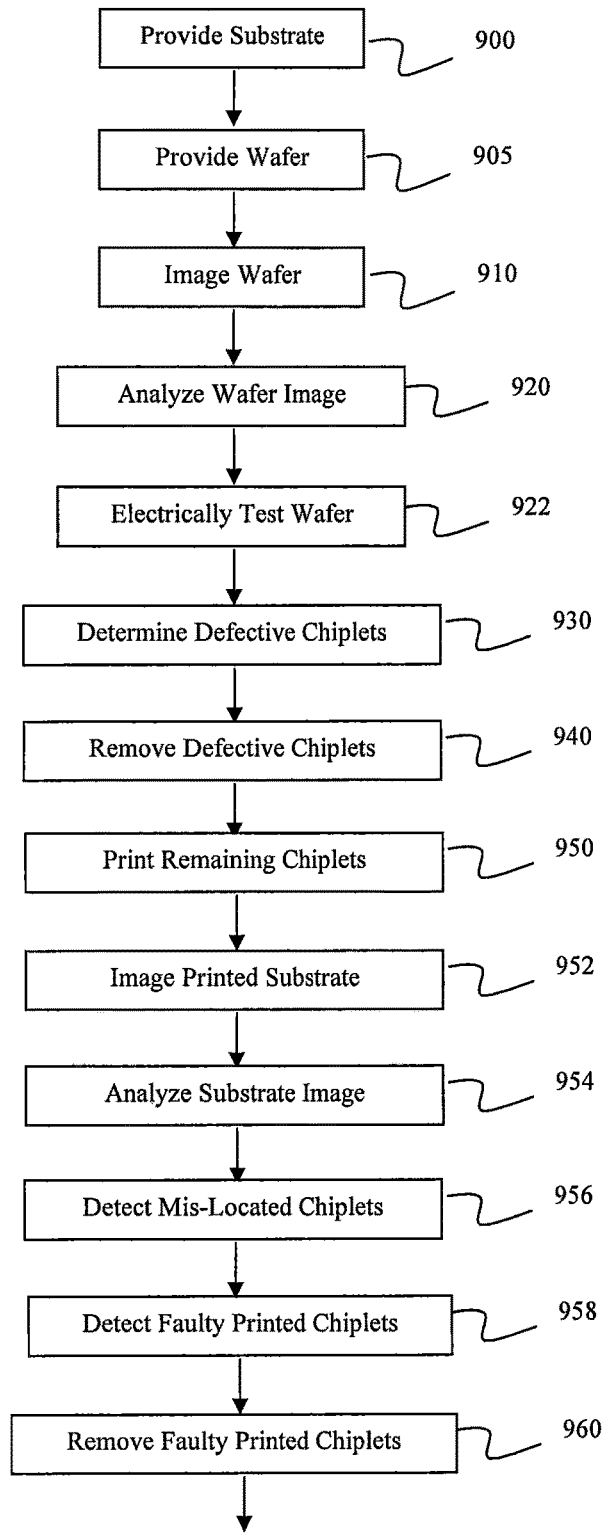
FIG. 11 is a flowchart illustrating an embodiment of a method according to the present invention.
Figure 11:
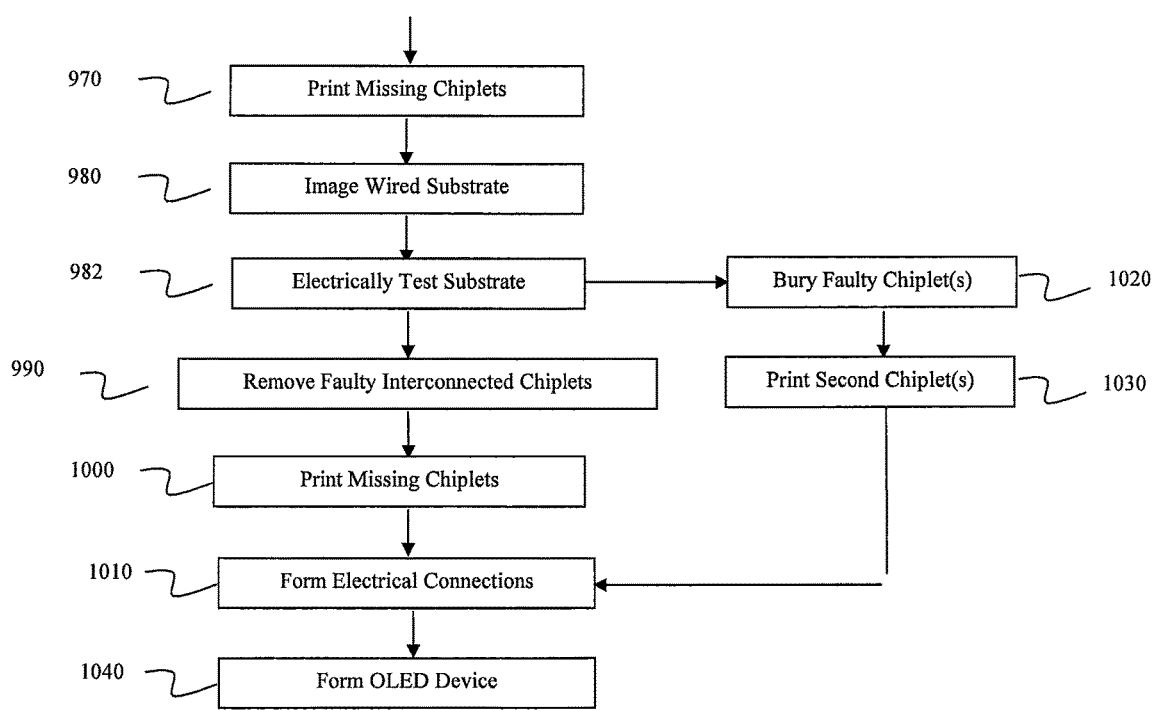

Referring to FIG. 11, a method of assembling integrated circuit elements on a receiving substrate according to some embodiments of the present invention is illustrated in a flow chart that incorporates the steps illustrated in FIG. 4 and serves to correct some or all of the deficiencies of the processes described above. According to some embodiments of the present invention, a method of making a large-format substrate with distributed integrated circuit control elements sequentially providing a substrate at step 900 and providing a wafer at step 905, the wafer having a plurality of separate, independent chiplets formed thereon; the chiplets formed, for example, by steps 510 and 520 of FIG. 4. The wafer is imaged at step 910 and the wafer image analyzed at step 920 to determine 930 which of the wafer chiplets are defective. The defective chiplet(s) are removed from the wafer at step 940, leaving remaining chiplets in place on the wafer. The defective chiplet(s) can be removed from the wafer by printing defective chiplet(s) onto a different adhesive substrate, for example, by the same process as is used to print onto the display substrate, or by using a different removal process. The remaining chiplet(s) are printed onto the substrate at step 950, for example, by steps 540 and 550 of FIG. 4, forming empty chiplet location(s) on the substrate. All of the remaining chiplets may be printed onto the substrate in parallel, e.g., substantially simultaneously in a parallel transfer printing operation. The additional chiplet(s) (also referred to herein as "missing" chiplets) are then printed at step 970, from the same or a different wafer, into the empty chiplet location(s) on the substrate. The substrate then is completely populated with chiplets and there are no missing chiplets or empty chiplet locations.

The chiplets printed are likely to be working chiplets, since the process of imaging at step 910 and analysis at step 920 of the chiplets can detect faulty chiplets so that only working chiplets are printed at step 950 onto the substrate. However, to further improve the likelihood of successful manufacture and to overcome any faults in the printing process itself, the substrate can be imaged at step 952 after the remaining chiplet(s) are printed at step 950 and the substrate image analyzed at step 954 to determine the empty chiplet location(s). This analysis at step 954 can be done in addition to the analysis of the wafer image at step 920.

In addition to detecting missing chiplets, the image of the printed chiplets can be used to detect mis-located chiplets at step 956. Alignment marks 130a and 130b can be used to determine with high precision (typically less than about 1 micrometer) the location and orientation of each chiplet. As used herein, a mis-located chiplet is one whose location on the substrate is not as desired or whose rotation or orientation on the substrate is not as desired or is otherwise misaligned relative to other chiplets. Furthermore, the image of the printed chiplets can be employed to detect faulty printed chiplets at step 958. This is useful for example, if the chiplets have been damaged in printing and/or as a second part of the faulty chiplet analysis in step 930.

Once detected, faulty or mis-located printed chiplets can be removed from the substrate at step 960. The chiplets can be lightly adhered to the substrate after printing, and the adhesive can be cured to form a more permanent adhesion. Hence, the chiplet can be removed before adhesive curing. For example, according to some embodiments of the present invention, a rework stamp having a single transfer post and an array of anti-sag features can be laminated onto the defective chiplet. The shape, profile and printing process parameters can be adjusted using flowing methods disclosed in U.S. patent application. Ser. No. 11/423,192 filed Jun. 9, 2006 titled "PATTERN TRANSFER PRINTING BY KINETIC CONTROL OF ADHESION TO AN ELASTOMERIC STAMP." and U.S. Pat. App. No. 61/116,136 filed Nov. 19, 2008 titled "PRINTING SEMICONDUCTOR ELEMENTS BY SHEAR-ASSISTED ELASTOMERIC STAMP TRANSFER" to insure successful retrieval of the chiplet from the substrate. Alternatively, an element (for example, a metal cylinder) having a substantially flat surface with holes can be located on the chiplet, the cylinder can be evacuated and the chiplet can be adhered to the flat surface by air pressure. The cylinder and chiplet can then mechanically remove the chiplet from the substrate. As another alternative, a mechanical device having small jaws can grasp the chiplet and mechanically remove it. Since the chiplets themselves are in the tens of microns in size, other methods in the mechanical arts can accomplish this removal at step 960. Once removed to form an empty chiplet location on the substrate, a chiplet can be printed into the empty chiplet location at step 970.

In further embodiments of the present invention, the chiplets on the wafer can be electrically tested at step 922, for example, by providing wires that connect to the chiplets formed on the wafer and employing circuitry on the wafer, or external to the wafer, to electrically stimulate the chiplets and test the chiplets' functionality. Those chiplets that fail the functional test can be determined to be defective, even without any visible, imaged faults. The tests can be done before or after release of the chiplets from the wafer. If done after release, the micro-bridges connecting the chiplets to the wafer can incorporate electrical connections. These electrical connections can be formed using selectively-doped silicon micro-bridges, poly-silicon or metal lines or any combination of the above. Serial first-in-first-out storage registers can be employed or addressing circuitry, together with serial or parallel registers for applying signals to the chiplets and recording signals from the chiplets to determine functionality. The electrical test can be done in addition to or as an alternative to the imaging test.

As described above, once a substrate is fully populated with operative chiplets, the substrate and chiplets can be processed to electrically interconnect the chiplet(s) with wires formed over the substrate. Organic electro-luminescent structures (e.g. OLEDs) that are operable responsive to signals provided by the chiplets can then be formed over the substrate at step 1040. The wires are employed to drive the circuits and operate the device. Unfortunately, the processes used to process the substrate and chiplets to form the electrically-interconnecting wires can fail so that the chiplets are not properly interconnected. In further embodiments of the present invention, the substrate can be imaged at step 980 to determine faulty interconnected chiplet(s), and/or an electrical test of the substrate and chiplet(s) can be performed at step 982 after the chiplet(s) are electrically interconnected to determine faulty interconnected chiplet(s).

Once the faulty interconnected chiplets are determined, the faulty interconnected chiplets may be removed at step 990 to form empty chiplet locations. The removal can be accomplished by removing material adhered to and surrounding the chiplet(s) and then removing the chiplet(s) to form empty chiplet location(s). For example, laser ablation or local chemical processing can be used to separate a faulty interconnected chiplet from the substrate and surrounding material. A photolithographic process comprising coating a photosensitive resin over the substrate and pattern-wise exposing and processing the photosensitive resin to form a locally chemically processable area over and around the chiplet(s) can be employed. Once removed, the missing chiplet(s) may be printed at step 1000 into the empty chiplet location(s) and then electrical interconnection(s) to the printed missing chiplet(s) may be formed at step 1010. Photolithographic processes can be employed, for example by first protecting the operative portions of the substrate, and then processing the substrate as before to form the local connections, and then removing remaining materials from the operative substrate areas.

In some embodiments of the present invention, rather than removing faulty interconnected chiplet(s), the faulty interconnected chiplet(s) can be buried at step 1020 under a planarization layer after first cutting any existing electrical connections, for example with a laser. Once the faulty interconnected chiplet(s) are buried, a second chiplet can be printed at step 1030 over one or more of the faulty interconnected chiplet(s) and then electrical interconnection(s) to the second chiplet can be formed.

In other embodiments of the present invention, to further enable the removal of defective or mis-located chiplets, a photosensitive adhesive can be coated over the substrate to adhere the printed chiplet(s) to the substrate. The adhesive can be negatively or positively exposed in the locations of defective or mis-located chiplet(s) to reduce the adhesion between the defective or mis-located chiplet(s) and the substrate. Thus, removal of the defective or mis-located chiplets may be facilitated.

The methods of the present invention can be employed to form an OLED device on the substrate at step 1040 to be controlled by the printed chiplet(s).

The flowcharts described above illustrate the architecture, functionality, and operations of embodiments of hardware and/or software according to various embodiments of the present invention. It will be understood that each block of the flowchart and/or block diagram illustrations, and combinations of blocks in the flowchart and/or block diagram illustrations, may be implemented by computer program instructions and/or hardware operations. In this regard, each block represents a module, segment, or portion of code, which comprises one or more executable instructions for implementing the specified logical function(s). It should be noted that, in other implementations, the function(s) noted in the blocks may occur out of the order noted in FIGS. 4 and 11. For example, two blocks shown in succession may, in fact, be executed substantially concurrently, or the blocks may sometimes be executed in the reverse order, depending on the functionality involved.

The computer program instructions may be provided to a processor of a general purpose computer, a special purpose computer, or other programmable data processing apparatus to produce a machine, such that the instructions, which execute via the processor of the computer or other programmable data processing apparatus, create means for implementing the functions specified in the flowchart and/or block diagram block or blocks. The computer program instructions may also be stored in a computer usable or computer-readable memory that may direct a computer or other programmable data processing apparatus to function in a particular manner, such that the instructions stored in the computer usable or computer-readable memory produce an article of manufacture including instructions that implement the function specified in the flowchart and/or block diagram block or blocks.

Accordingly, embodiments of the present invention may provide advantages such that, by providing a process having examination, test, and replacement operations at various stages of assembly, the overall yield of substrates may be improved.

The invention has been described in detail with particular reference to certain preferred embodiments thereof, but it should be understood that variations and modifications could be effected within the spirit and scope of the invention.

What is claimed is:

1. A system comprising:
a wafer of chiplets, the wafer comprising:
a source substrate having an array of regularly-spaced chiplet locations thereon; and
a plurality of chiplets native to the source substrate, each chiplet of the plurality of chiplets disposed on the source substrate in one of the chiplet locations in the array, wherein one or more of the chiplet locations in the array is a removed-chiplet location that is devoid of a chiplet and the removed-chiplet location(s) form an irregular arrangement; and
a storage device, distinct from the plurality of chiplets, for storing a record of locations of chiplets determined to be defective, wherein the locations of the chiplets determined to be defective correspond to the removed-chiplet locations.

2. The system of claim 1, wherein each chiplet of the plurality of chiplets is partially released from the substrate such that each chiplet is connected to the substrate via a micro-bridge of a plurality of micro-bridges.

3. The system of claim 1, wherein each chiplet is connected to the substrate via a micro-bridge of a plurality of micro-bridges.

4. The system of claim 3, wherein each micro-bridge supports a respective chiplet.

5. The system of claim 3, comprising a plurality of anchors on the source substrate, wherein each micro-bridge is connected to an anchor of the plurality of anchors.

6. The system of claim 5, comprising a buried oxide layer under the plurality of anchors.

7. The system of claim 6, wherein the buried oxide layer is under the chiplet.

8. The system of claim 3, wherein the plurality of micro-bridges connecting the chiplets to the wafer comprise electrical connections.

9. The system of claim 8, wherein the micro-bridges comprise selectively-doped semiconductor material, thereby providing the electrical connections.

10. The system of claim 8, wherein the electrical connections comprise metal lines.

11. The system of claim 8, wherein respective ones of the plurality of chiplets are coupled to the storage device via the electrical connections of respective ones of the plurality of micro-bridges.

12. The system of claim 1, comprising wires connected to the plurality of chiplets.

13. The system of claim 1, comprising electrical connections to each chiplet of the plurality of chiplets.

14. The system of claim 1, comprising test circuitry for electrically stimulating the plurality of chiplets to test chiplet functionality.

15. The system of claim 1, wherein the one or more storage devices are one or more storage registers.

16. The system of claim 1, wherein the chiplets are organic light emitting diodes.

17. The system of claim 1, wherein the chiplets have a thickness of less than 20 micrometers.

18. The system of claim 1, wherein the chiplets are configured to control organic light emitting diodes.

19. The system of claim 1, wherein the chiplets are arranged to control electrical current to pixels.

20. The system of claim 1, wherein remaining chiplets of the plurality of chiplets do not form a regularly-spaced array.

21. The system of claim 1, wherein the storage device is on the wafer.

* * * * *